United States Patent
Inaba et al.

(10) Patent No.: US 9,480,166 B2
(45) Date of Patent: Oct. 25, 2016

(54) METHOD OF MANUFACTURING NON-FIRING TYPE ELECTRODE

(71) Applicant: E I DU PONT DE NEMOURS AND COMPANY, Wilmington, DE (US)

(72) Inventors: Akira Inaba, Kawasaki (JP); Satomi Yamashita, Kawasaki (JP)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 154 days.

(21) Appl. No.: 14/217,631

(22) Filed: Mar. 18, 2014

(65) Prior Publication Data

US 2014/0306165 A1  Oct. 16, 2014

Related U.S. Application Data

(60) Provisional application No. 61/812,356, filed on Apr. 16, 2013.

(51) Int. Cl.
| | |
|---|---|
| *H01B 1/22* | (2006.01) |
| *H05K 3/12* | (2006.01) |
| *H05K 3/10* | (2006.01) |
| *H05K 1/03* | (2006.01) |
| *C09D 185/04* | (2006.01) |
| *C09D 5/24* | (2006.01) |
| *C08K 3/08* | (2006.01) |
| *H05K 1/09* | (2006.01) |

(52) U.S. Cl.
CPC . *H05K 3/12* (2013.01); *C08K 3/08* (2013.01); *C09D 5/24* (2013.01); *C09D 185/04* (2013.01); *H01B 1/22* (2013.01); *H05K 1/0306* (2013.01); *H05K 1/095* (2013.01); *H05K 3/10* (2013.01); *H05K 3/102* (2013.01); *C08G 2650/56* (2013.01)

(58) Field of Classification Search
None
See application file for complete search history.

(56) References Cited

U.S. PATENT DOCUMENTS

| | | | | |
|---|---|---|---|---|
| 3,637,572 | A * | 1/1972 | Ogata et al. | C08G 59/72 523/220 |
| 2006/0082952 | A1 | 4/2006 | Ogiwara | |
| 2009/0141472 | A1* | 6/2009 | Choi | C08G 59/621 361/820 |

FOREIGN PATENT DOCUMENTS

| | | | | |
|---|---|---|---|---|
| BE | WO 2012038373 A1 * | 3/2012 | | C09J 9/02 |
| KR | 100945571 B1 | 3/2010 | | |

OTHER PUBLICATIONS

Cornell University, "Substrates: Background", published on Sep. 12, 2008, pp. 1-20; attached to the case file as a PDF, available online at http://people.ccmr.cornell.edu/~cober/MSE5420/page2/files/iNEMISubstrateFlex0808.pdf.*

(Continued)

*Primary Examiner* — Mark Kopec
*Assistant Examiner* — Katie L Hammer

(57) ABSTRACT

A method of manufacturing a non-fired type electrode comprising the steps of: (a) applying a conductive paste on a substrate, the conductive paste comprising; (i) 100 parts by weight of a conductive powder; (ii) an organic boron compound comprising an amine borate, a boronic acid, a boronic acid ester, a trimer of the boronic acid or a mixture thereof, wherein the boron element of the organic boron compound is 0.03 to 1.4 parts by weight; and (iii) 20 to 150 parts by weight of an organic vehicle; and (b) heating the applied conductive paste at 100 to 300° C.

9 Claims, 1 Drawing Sheet

(56) References Cited

OTHER PUBLICATIONS

Hall, D. G. (2011) Structure, Properties, and Preparation of Boronic Acid Derivatives, in Boronic Acids: Preparation and Applications in Organic Synthesis, Medicine and Materials (vol. 1 and 2), Second Edition (ed. D. G. Hall), Wiley-VCH Verlag GmbH & Co. KGaA, Weinheim, Germany. doi: 10.1002/9783527639328.ch1; pp. 1-134 attached as PDF.*

Database WPI, Week 201027, Thomson Scientific, London, GB; AN 2010-D11206, XP002726224, -& KR 100 945 571 B1 (I-SENS Inc) March 8, 2010 (Mar. 8, 2010) Abstract, Paragraphs [0001], [0025], [0030], [0043], [0057], [0063], [0066], [0067].

EL1145WOPCT (PCT/US/2014/033252—Filed Jul. 4, 2014) International Search Report and the Written Opinion of the International Searching Authority.

International Preliminary Report on Patentability Dated October 20, 2015 for International Patent Application No. PCT/US2014/033252.

* cited by examiner

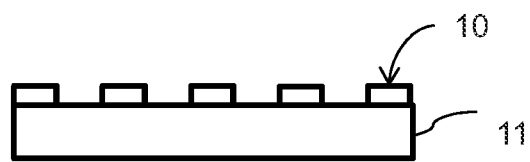

METHOD OF MANUFACTURING NON-FIRING TYPE ELECTRODE

CROSS-REFERENCE TO RELATED APPLICATION

This application claims the benefit of U.S. Provisional Application No. 61/812,356, filed Apr. 16, 2013.

FIELD OF INVENTION

The present invention relates to a method of manufacturing a non-fired type electrode using a conductive paste.

TECHNICAL BACKGROUND OF THE INVENTION

Electrical devices or substrates which can be damaged by high temperature treatment during manufacturing process need a non-fired type electrode. The term "non-fired type electrode" is defined as an electrode formed without a heat treatment at a temperature of 350° C. or higher.

US20060082952 discloses a non-fired type electrically conductive paste that is cured at 200° C. or lower to form an electrode. The conductive paste comprises a silver powder with a mean particle size of 1 μm or less, tetrafluoroethylene, hexafluoropropylene, and vinylidene fluoride dispersed in a solvent.

BRIEF SUMMARY OF THE INVENTION

An objective is to provide a method of manufacturing a non-fired type electrode, which enables the formation of an electrode with a low resistivity.

An aspect of the invention relates to a method of manufacturing a non-fired type electrode comprising steps of: (a) applying a conductive paste on a substrate, the conductive paste comprises; (i) 100 parts by weight of a conductive powder; (ii) an organic boron compound comprising an amine borate, a boronic acid, a boronic acid ester, a trimer of a boronic acid or a mixture thereof, wherein boron (B) element of the organic boron compound is 0.03 to 1.4 parts by weight; and (iii) 20 to 150 parts by weight of an organic vehicle; (b) heating the applied conductive paste at 100 to 300° C.

Another aspect of the invention relates to a non-fired type of conductive paste comprising: (i) 100 parts by weight of a conductive powder; (ii) an organic boron compound comprising an amine borate, a boronic acid, a boronic acid ester, a trimer of a boronic acid or a mixture thereof, wherein boron (B) element of the organic boron compound is 0.03 to 1.4 parts by weight; and (iii) 20 to 150 parts by weight of an organic vehicle.

Another aspect of the invention relates to a device having the non-fired type electrode manufactured by the method above.

The non-fired type electrode with a low resistivity can be formed by the present invention.

BRIEF DESCRIPTION OF THE DRAWINGS

FIG. 1 is a cross sectional diagram of the electrode formed on a substrate.

DETAILED DESCRIPTION OF THE INVENTION

The non-fired type electrode is formed by a method using a conductive paste. The method of manufacturing the electrode and the conductive paste used therein is explained respectively below.

Method of Manufacturing Electrode

The method of manufacturing an electrode comprising the steps of applying the conductive paste onto a substrate, and heating the applied conductive paste. The method is described below along with FIG. 1.

The conductive paste 11 is applied onto a substrate 10. There is no restriction on the substrate 10. The substrate 10 can be a polymer film, a glass substrate, a ceramic substrate or a semiconductor substrate in an embodiment. In another embodiment, the substrate 11 can be the polymer film or the semiconductor substrate that can be damaged by high temperature.

The conductive paste 10 can be applied on the substrate 11 by screen printing, inkjet printing, gravure printing, stencil printing, spin coating, blade coating or nozzle discharge in an embodiment. The screen printing can be taken in another embodiment because the screen printing can relatively easily form a desired pattern in a short time by using a screen mask.

The viscosity of the conductive paste is between 30 to 500 Pa·s measured by Brookfield HBT with a spindle #14 at 10 rpm in an embodiment. In the event of screen printing, the viscosity of the conductive paste can be 60 to 200 Pa·s.

The applied conductive paste 10 is heated at 100 to 300° C. thereby the conductive paste is cured to become an electrode. The heating temperature can be 120 to 250° C. in another embodiment, 150 to 220° C. in another embodiment. The heating time can be 10 to 90 minutes in an embodiment, 15 to 70 minutes in another embodiment, and 20 to 45 minutes in another embodiment. The heating temperature can be adjustable by combination with heating time such as low temperature for long time or high temperature for short time.

The pattern of the formed electrode could contain a line pattern having width of 1 μm to 10 mm and thickness of 1 to 100 μm in an embodiment, width of 30 μm to 6 mm and thickness of 3 to 70 μm in another embodiment, width of 100 μm to 3 mm and thickness of 8 to 30 μm in another embodiment. Such line pattern can be sometimes required in electrical devices.

The non-fired electrode formed by the present invention could keep the low resistivity even after being used for long time as shown in Example below. The electrical resistivity of the formed electrode after 300 hours use in an electrical device can be 0.3 mΩ·cm or lower in an embodiment, 0.1 mΩ·cm in another embodiment.

The electrode manufactured by the method can be used in any electrical devices. Examples of the electrical devices are a solar cell, a touch-panel, a plasma display panel (PDP) and a light-emitting diode (LED) module.

Conductive Paste

The conductive paste comprises at least (i) a conductive powder, (ii) an organic boron compound and (iii) an organic vehicle.

(i) Conductive Powder

The conductive powder is any powder having electrical conductivity.

The conductive powder can comprise a metal having conductivity of at least $1.00 \times 10^7$ $\Omega^{-1} \cdot m^{-1}$ at 293 Kelvin in an embodiment. The conductive powder can comprise a metal selected from the group consisting of aluminum (Al), nickel (Ni), copper (Cu), silver (Ag), gold (Au), platinum (Pt), palladium (Pd), molybdenum (Mo), tungsten (W), zinc (Zn), alloy thereof and a mixture thereof in another embodiment.

In another embodiment, the conductive powder can comprise at least Al, Ni, Zn, Cu, alloy thereof and a mixture thereof. The conductive powder comprises at least Cu, Cu alloy or a mixture thereof in another embodiment. Such metals are relatively easily oxidized at high temperature therefore it can be used in the non-fired type electrode.

The conductive powder can comprise the alloy comprising a base metal such as Cu, Al, and Ni in another embodiment. Examples of the alloy are an alloy of aluminum and silicon (Al—Si), aluminum and copper (Al—Cu), aluminum and zinc (Al—Zn), nickel and Niobium (Ni—Nb), nickel and cobalt (Ni—Co), copper and nickel (Cu—Ni), copper and zing (Cu—Zn), and copper and tin (Cu—Sn).

The conductive powder comprising the base metal of Cu, Al, or Ni can be coated with a noble metal. The noble metal can be Ag, Au, Pt or alloy thereof. The noble metal to coat the base metal is Ag which is relatively inexpensive in another embodiment. The noble metal which has relatively low-level oxidation by being heated can reduce the base metal oxidation.

There is no limitation on shape of the conductive powder. However, a flaky conductive powder, spherical conductive powder or a mixture thereof are often used.

The particle diameter (D50) of the conductive powder can be 0.5 to 10 μm in an embodiment, 1 to 8 μm in another embodiment, 1.5 to 4 μm in another embodiment. The particle diameter within the range can be dispersed well in the paste. The conductive powder with such particle size can disperse well in the organic vehicle. The average diameter (D50) is obtained by measuring the distribution of the powder diameters by using a laser diffraction scattering method with Microtrac model X-100.

The conductive powder can be 40 to 90 weight percent (wt %) in an embodiment, 52 to 85 wt % in another embodiment, 65 to 80 wt % in another embodiment, based on the weight of the conductive paste. Within the range of conductive powder content, conductivity of the electrode can be sufficient.

(ii) Organic Boron Compound

The organic boron compound is an organic compound that contains at least one boron atom and one or more of carbon atom in a molecular. The organic boron compound is an amine borate, a boronic acid, a boronic acid ester, a trimer of the boronic acid or a mixture thereof.

The amine borate is an electrovalent compound of an amine compound and a boric acid compound. The amine compound contains primary amine, secondary amine, tertiary amine or a mixture thereof. The amine compound can be, for example, ethylenediamine, diethylenetriamine, triethylenetetramine, tetraethylenepentamine, pentaethylenehexamine, propylenediamine, dipropylenetriamine, cyclohexanediamine, hexamethylene diamine, triethylenediamine, trimethylhexamethylene diamine, bis(hexamethylene)triamine, ethanolamine, diethanolamine, methylamine, butylamine, 2-propylamin, 2-aminopropan, ethylamine, etheramine, pentylamine, hexylamine, heptylamine, octylamine, myristylamine, laurylamine, dihexylamine, dipropylamine, 1-(Dimethylamino)decane, piperidine, or piperazine.

The boric acid compound is expressed by formula $B(OR)_n(OH)_{3-n}$ where n is 0 to 3, and R is independently alkyl group, substituted alkyl group, alkenyl group, substituted alkenyl group, aryl group or substituted aryl group.

The alkyl group is derived from aliphatic hydrocarbons and expressed with the formula $[C_nH_{2n+1}]$. The carbon number in the formula can be 1 to 20 in an embodiment, 1 to 10 in another embodiment. The alkyl group can be methyl group, ethyl group, propyl group, propene group, butyl group, pentyl group, hexyl group, or octyl group in an embodiment.

The substituted alkyl group is a group such that at least one hydrogen atom of the alkyl group is displaced with, in an embodiment, one or more of substituent selected from the group consisting of alkoxy group, alkyl group, allyl group, aryl group, amino group, amide group, acetamide group, nitro group, carbonyl group, carbamoyl group, hydroxyl group, thiol group and acetyl group.

The alkenyl group is derived from an alkene $(C_nH_{2n})$ from which a hydrogen atom is removed and contains at least one double bond. The carbon number in the formula can be 2 to 20 in an embodiment, 2 to 10 in another embodiment. The alkenyl group can be vinyl group, allyl group, propenyl group, butenyl group, crotyl group, hexenyl group and methacrylic group.

The substituted alkenyl group is a group such that at least one hydrogen atom of the alkenyl group is displaced with, in an embodiment, one or more of substituent selected from the group consisting of alkoxy group, alkyl group, allyl group, aryl group, amino group, amide group, acetamide group, nitro group, carbonyl group, carbamoyl group, hydroxyl group, thiol group and acetyl group.

The aryl group is derived from an aromatic hydrocarbon from which a hydrogen atom is removed. The aryl group can be phenyl group, tolyl group, xylyl group, naphthyl group, thienyl group or anisyl group in an embodiment.

The substituted aryl group is a group such that at least one hydrogen atom of the aryl group is displaced with one or more of substituent selected from the group consisting of alkoxy group, alkyl group, allyl group, aryl group, amino group, amide group, acetamide group, nitro group, carbonyl group, carbamoyl group, hydroxyl group, thiol group, indole group and acetyl group in an embodiment.

The amine borate can be triethanolamine borate (CAS number: 283-56-7, Molecular weight: 156.98, Melting point: 235° C.) of formula of,

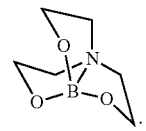

The boronic acid is a substituted boric acid in which one or two of OH group is replaced with one or two of substituent(s).

In one embodiment, the boronic acid is the substituted boric acid that has a substituent which was replaced with one OH group of boric acid $(B(OH)_3)$, which is expressed with formula (I),

where R is independently alkyl group, substituted alkyl group, alkenyl group, substituted alkenyl group, aryl group or substituted aryl group.

Specific examples of the boronic acid of formula (I) are; Methylboronic acid (R: methyl group, CAS No: 13061-96-6, Molecular weight: 59.86, Melting point: 91° C.) with the formula of,

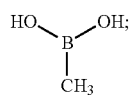

Cis-1-propen-1-ylboronic acid (R: propene group, CAS No: 7547-96-8, Molecular weight: 85.9, Melting point: 65° C.) with the formula of,

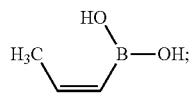

Trans-propenylboronic acid (R: propene group, CAS No: 7547-97-9, Molecular weight: 85.9, Melting point: 123° C.) with the formula of,

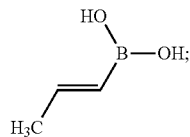

Phenylboronic acid (R: phenyl group, CAS No: 98-80-6, Molecular weight: 121.93, Melting point 216° C.) with the formula of,

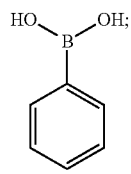

2-thienylboronic acid (R: thienyl group, CAS No: 6165-68-0, Molecular weight: 127.96, Melting point 138° C.) with the formula of,

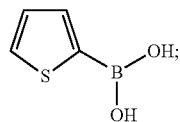

3-aminophenyl boronic acid monohydrate (R: aminophenyl group, CAS No: 7547-97-9, Molecular weight: 154.96, Melting point: 93 to 96° C.) with

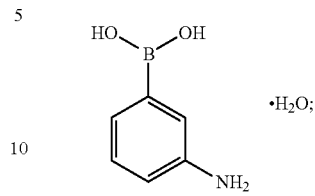

2,4,6-trimethylphenylboronic acid (R: 2,4,6-trimethylphenyl group, CAS No: 149104-90-5, Molecular weight: 164.01, Melting point: 115 to 122° C.) with the formula of,

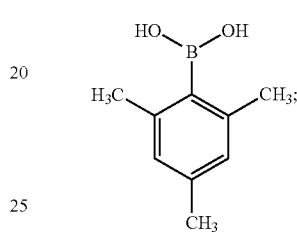

4-acetylphenylboronic acid (R: acetylphenyl group, CAS No: 5980-97-2, Molecular weight: 163.97, Melting point: 240 to 244° C.) with the formula of,

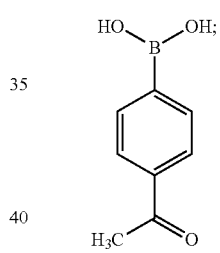

3-acetamidophenylboronic acid (R: acetamidophenyl group, CAS No: 78887-39-5, Molecular weight: 178.98, Melting point: 140° C.) with the formula of,

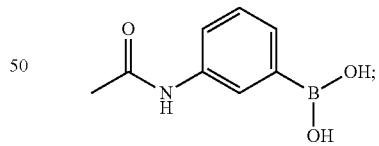

4-carbamoylphenylboronic acid (R: carbamoylphenyl group, CAS No: 123088-59-5, Molecular weight: 164.95, Melting point: 242° C.) with the

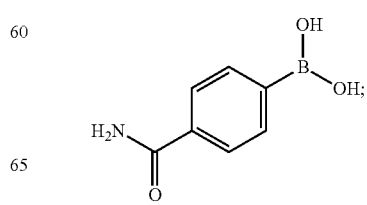

3,5-dimethoxyphenylboronic acid (R: 3,5-dimethoxyphenyl group, CAS No: 192182-54-0, Molecular weight: 181.98, Melting point: 205° C.) with the formula of,

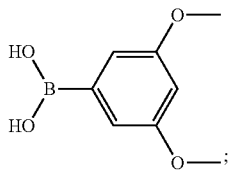

3-(dimethylcarbamoyl)phenylboronic acid (R: dimethylcarbamoyl-phenyl group, CAS No: 373384-14-6, Molecular weight: 193.01, Melting point: 122° C.) with the formula of,

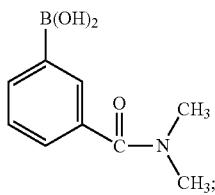

and
6-indoleboronic acid (R: indole group, CAS No: 147621-18-9, Molecular weight: 160.97, Melting point: 177° C.) with the formula of,

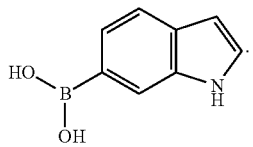 [SMILES: OB(O)c1ccc2cc[nH]c2c1]

In another embodiment, the boronic acid can be the substituted boric acid that has a substituent which was replaced with two OH groups of B(OH)$_3$, which is expressed with formula (II),

(II)

where R and R' is independently alkyl group, substituted alkyl group, alkenyl group, substituted alkenyl group, aryl group or substituted aryl group.

Specific examples of the boronic acid of formula (II) is dimesitylborinic acid (R and R': 2,4,6-trimethylphenyl group, CAS No: 20631-84-9, Molecular weight: 266.19, Melting point: 144° C.) with the formula of,

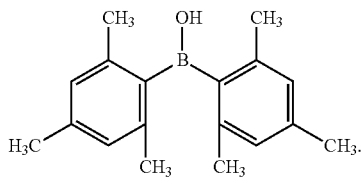

The boronic acid ester is an ester formed between a boronic acid and an alcohol. The boronic acid ester can be expressed with formula (III) in an embodiment.

(III)

where R, R' and R" is independently alkyl group, substituted alkyl group, alkenyl group, substituted alkenyl group, aryl group or substituted aryl group.

Specific examples of the boronic acid ester expressed with formula (III) are,
phenyl boronic acid trimethylene glycol ester (R' and R": propyl group, CAS No: 4406-77-3, Molecular weight: 161.99, Melting point: 106° C.) with the formula of,

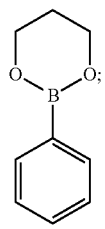 [SMILES: c1ccc(B2OCCCO2)cc1]

Diisopropoxymethylborane (R: methyl group, R' and R": Isopropyl, CAS No: 86595-27-9, Molecular weight: 144.02, Melting point: 105° C.) with the formula of,

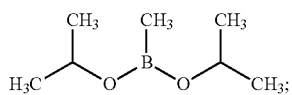

2,6-dimethyl-4-(4,4,5,5-tetramethyl-1,3,2-dioxaborolan-2-yl)phenol (R: 2,6-Dimethylphenol group, R' and R": 1,1,2,2,tetramethyl ethyl group, CAS No: 269410-25-5, Molecular weight: 248.13, Melting point: 108° C.) with the formula of,

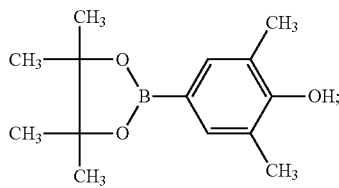 [SMILES: Cc1cc(B2OC(C)(C)C(C)(C)O2)cc(C)c1O]

2-(4-biphenylyl)-4,4,5,5-tetramethyl-1,3,2-dioxaborolane (R: 4-biphenylyl, R' and R": 1,1,2,2,tetramethyl ethyl group, CAS No: 144432-80-4, Molecular weight: 280.17, Melting point: 112° C.) with the formula of,

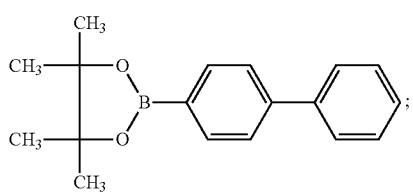 [SMILES: CC1(C)OB(c2ccc(-c3ccccc3)cc2)OC1(C)C]

4-aminophenylboronic acid pinacol ester (R: 4-aminophenyl, R' and R": 1,1,2,2,tetramethyl ethyl group, CAS No: 214360-73-3, Molecular weight: 219.09, Melting point: 170° C.) with the formula of,

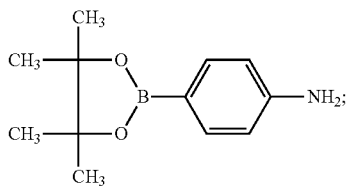

and
4-(dimethylamino)phenylboronic acid pinacol ester (R: 4-(Dimethylamino)phenyl, R' and R": 1,1,2,2,tetramethyl ethyl group, CAS No: 171364-78-6, Molecular weight: 247.15, Melting point: 125° C.) with the formula of,

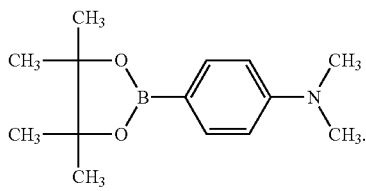

The boronic acid ester can be also expressed with formula (IV) in another embodiment.

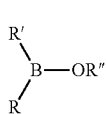

(IV)

where R, R' and R" is independently alkyl group, substituted alkyl group, alkenyl group, substituted alkenyl group, aryl group or substituted aryl group.

Specific examples of the boronic acid ester of formula (IV) is 2-aminoethyl diphenyl borinate (R and R': Phenyl group, R": Aminoethyl group, CAS No: 524-95-8, Molecular weight: 225.09, Melting point: 187° C.) with the formula of,

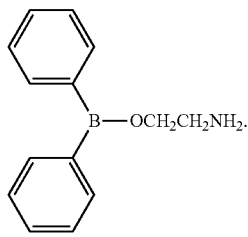

The trimer of the boronic acid is a boronic anhydride formed by dehydration synthesis of three molecules the boron acids.

The trimer of the boronic acid is 2,4,6-triphenyl boroxin in an embodiment.

Specific examples of the trimer of the boronic acid is, 2,4,6-triphenyl boroxin (CAS No: 3262-89-3, Molecular weight: 311.0, Me

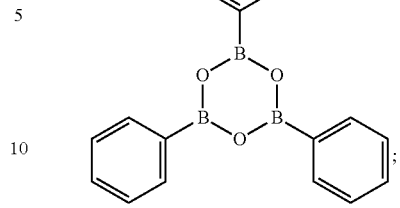

with the formula of,
4-methylphenyl boronic acid anhydride (CAS No: 5084-80-0, Molecular weight: 353.0, Melting point: 243° C.) with the formula of,

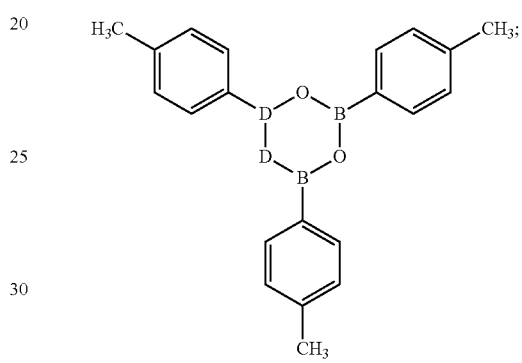

and
2,4,6-tris(3,4,5-trifluorophenyl)boroxin (CAS No: 223440-94-6, Molecular weight: 473.0, Melting point: 287° C.) with the formula of,

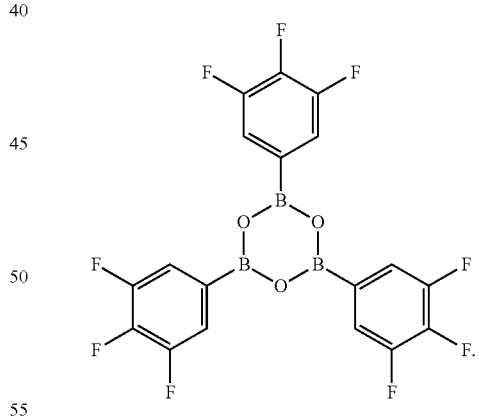

The organic boron compound is selected from the group consisting of a boronic acid, a boronic acid ester, a trimer of the boronic acid or a mixture thereof in another embodiment. The organic boron compound comprises a trimer of the boronic acid in another embodiment. The boronic acid is expressed with formula (I) described above in another embodiment. The boronic acid ester is expressed with formula (IV) described above in another embodiment.

The organic boron compound comprises an aryl group, a substituted aryl group or a mixture thereof in another embodiment. The aryl group and/or the substituted aryl group combine with boron (B) in the organic boron compound in another embodiment.

The organic boron compound comprises the at least one amino group (—NH$_2$) in another embodiment.

The organic boron compound can be selected from the group consisting of 2-aminoethyl diphenyl borinate, dimesitylborinic acid, 2,4,6-trimethylphenyl-boronic acid, 3-aminophenylboronic acid monohydrate, triethanol amine borate, methylboronic acid, 4-acetylphenylboronic acid, 3-acetamidophenylboronic acid, 4-carbamoylphenylboronic acid, 3,5-dimethoxyphenylboronic acid, 3-(dimethylcarbamoyl)phenylboronic acid, 6-indoleboronic acid, phenyl boronic acid trimethylene glycol ester, diisopropoxymethylborane, 2,6-Dimethyl-4-(4,4,5,5-tetramethyl-1,3,2-dioxaborolan-2-yl)phenol, 2-(4-Biphenylyl)-4,4,5,5-tetramethyl-1,3,2-dioxaborolane, 4-aminophenylboronic acid pinacol ester, 4-(dimethylamino)phenylboronic acid pinacol ester, 2,4,6-triphenyl boroxin, 4-methylphenyl boronic acid anhydride, 2,4,6-tris(3,4,5-trifluorophenyl)boroxin and a mixture thereof in another embodiment.

The organic boron compound can be selected from the group consisting of 2-aminoethyl diphenyl borinate, dimesitylborinic acid, 2,4,6-trimethylphenyl-boronic acid, 3-aminophenylboronic acid monohydrate, 2,4,6-triphenyl boroxin and a mixture thereof in another embodiment.

The organic boron compound comprises 2,4,6-triphenyl boroxin in another embodiment.

The conductive paste comprising such organic boron compounds could form an electrode with a sufficient electrical property as shown in Example below.

Melting point of the organic boron compound is 50° C. or higher in an embodiment, 65° C. or higher in another embodiment, 73° C. or higher in another embodiment, 85° C. or higher in another embodiment. The melting point of the organic boron compound can be 280° C. or lower in another embodiment, 200° C. or lower in another embodiment, 170° C. or lower in another embodiment. The organic boron compound in the melting point range can be effective on the conductivity of the formed electrode as shown in Example below.

The boron (B) element of the organic boron compound is 0.03 to 1.4 parts by weight, 0.1 to 1.0 parts by weight in another embodiment, 0.2 to 0.8 parts by weight in another embodiment, against 100 parts by weight of the conductive powder. With such amount of boron, the electrical conductivity of the electrode can be sufficiently low as shown in Example below.

The adding amount of the organic boron compound can be adjusted based on the desired amount of boron element. In an embodiment, the organic boron compound can be 0.5 to 20 parts by weight, 0.7 to 13 parts by weight in another embodiment, 0.9 to 8 parts by weight in another embodiment, against 100 parts by weight of the conductive powder.

(iii) Organic Vehicle

The conductive powder and the organic boron compound are dispersed into the organic vehicle to form a viscous composition called "paste", having suitable viscosity for applying on a substrate with a desired pattern.

The organic vehicle is 20 to 150 parts by weight, 22 to 75 parts by weight in another embodiment, 25 to 50 parts by weight against 100 parts by weight of the conductive powder in another embodiment. The conductive paste containing such amount of the organic vehicle can form the electrode with sufficient electrical conductivity, because the organic vehicle entirely or partially remains in the non-fired electrode.

The organic vehicle can contain at least an organic polymer and optionally a solvent in an embodiment.

A wide variety of inert viscous materials can be used as the organic polymer, for example ethyl cellulose, ethylhydroxyethyl cellulose, wood rosin, epoxy resin, phenoxy resin, acrylic resin or a mixture thereof. The solvent such as texanol, terpineol or carbitol acetate can be used to adjust the viscosity of the conductive paste to be preferable for applying onto the substrate.

The organic vehicle can further comprise a photopolymerization initiator and a photopolymerizable compound when using a photolithographic method.

The photopolymerization initiator is thermally inactive at 185° C. or lower, but it generates free radicals when it is exposed to an actinic ray. A compound that has two intramolecular rings in the conjugated carboxylic ring system can be used as the photopolymerization initiator, for example ethyl 4-dimethyl aminobenzoate (EDAB), diethylthioxanthone (DETX), and 2-methyl-1[4-(methylthio)phenyl]-2-morpholinopropan-1-one. The photopolymerization initiator can be 2 to 9 wt % based on the weight of the organic vehicle in an embodiment.

The photopolymerization compound can comprise an organic monomer or an oligomer that includes ethylenic unsaturated compounds having at least one polymerizable ethylene group. Examples of the photopolymerization compound are ethocylated (6) trimethylolpropane triacrylate, and dipentaerythritol pentaacrylate.

The photopolymerization compound can be 20 to 45 wt % based on the weight of the organic vehicle in an embodiment.

For the organic vehicle to be used in photolithographic method, U.S. Pat. No. 5,143,819, U.S. Pat. No. 5,075,192, U.S. Pat. No. 5,032,490, U.S. Pat. No. 7,655,864 can be herein incorporated by reference.

(iv) Additive

An organic additive such as a dispersing agent, a stabilizer and a plasticizer or an inorganic additive such as metal oxide powder can be added to the conductive paste based on a desired property of the formed electrode.

EXAMPLE

The present invention is illustrated by, but is not limited to, the following examples.

Paste Preparation

Carbitol acetate as a solvent and phenoxy resin as an organic polymer were mixed together at 100° C. until all of phenoxy resin had dissolved to form the organic vehicle. The organic vehicle was filtered through a 20 micron mesh. Carbitol acetate was 75 wt % and phenoxy resin was 25 wt % based on the weight of the organic vehicle.

The conductive powder and the organic boron compound were added to the organic vehicle to mix well by a mixer followed by a three-roll mill, thereby the conductive paste was made. The conductive powder was a spherical Cu—Zn alloy powder coated with Ag where Ag was 10 wt % based on the weight of the conducive powder. The particle diameter (D50) was 2.0 μm. The organic boron compound was 2-aminoethyldiphenylborinate (D9754-5G, Sigma-Aldrich Co. LLC.). The conductive paste composition is shown in Table 1 with amount as "parts by weight".

Manufacturing an Electrode

The conductive paste was screen printed onto an alumina substrate. The screen mask had a line pattern of 1.0 mm wide and 200 mm long. The printed conductive paste on the alumina substrate was heated at 200° C. for 30 minutes in a constant temperature oven (DN-42, Yamato Scientific Co., Ltd.).

Measurement of Specific Electrical Resistance

The specific electrical resistance (mΩ·cm) was obtained by calculating the following equation (1). The resistance (Ω) was measured with a multimeter (34401A from Hewlett-Packard Company). The width was 0.1 cm, the thickness was 0.0018 cm, and the length was 20 cm in average according to the measurement by a microscope having the measurement system.

$$\text{Specific electrical resistance(m}\Omega\cdot\text{cm)=Resistance (m}\Omega)\times\text{electrode width(cm)}\times\text{electrode thickness (cm)/electrode length(cm)} \quad (1)$$

The resistance was measured twice, right after forming the electrode (0 hour) at the first time. The second time was after keeping the electrode at 150° C. for 300 hours in a constant-temperature oven in order to see long-term heat resistance. The electrical property could become poorer by heat during practical use.

Result

The specific electrical resistance of the electrode as in Example 1 to 3 where the conductive paste contained the organic boron compound was about half or even lower compared to the resistance of the electrode containing no organic boron compound as in Comparative (Com.) Example 1 at both 0 hour and 300 hours. Especially in Example 2 and 3, the resistance stayed low, not exceeding 0.15 mΩ·cm even after 300 hours heated.

TABLE 1

(parts by weight)

| | Com. Example 1 | Example. 1 | Example. 2 | Example. 3 |
|---|---|---|---|---|
| Cu powder | 100 | 100 | 100 | 100 |
| Organic boron compound: 2-aminoethyl-diphenylborinate | 0 | 1.4 | 4.3 | 7.2 |
| (Boron amount) | (0) | (0.07) | (0.21) | (0.35) |
| Organic vehicle | 32.3 | 32.3 | 32.3 | 32.3 |
| Specific electrical resistance at 0 h (mΩ · cm) | 0.39 | 0.15 | 0.11 | 0.10 |
| Specific electrical resistance at 300 h (mΩ · cm) | 1.11 | 0.26 | 0.14 | 0.12 |

Other organic boron compounds were examined. An electrode was formed in the same manner as in Example 1 above except for using different organic boron compound as shown in Table 2 and using a conductive powder contained the Ag coating of not 10 wt % but 20 wt % based on the weight of the conductive powder. The organic boron compound was used with an amount that boron element was 0.21 parts by weight against 100 parts by weight of the conductive powder.

The resistance at 0 hour was lower than 0.2 mΩ·cm and it was kept low after 300 hours heating at 150° C. in Example 4 to 6 when using the specific organic boron (OBC 1 to 3) as shown in Table 3 and Table 2. In Com. Example 2 to 4 that used OBC4, OBC5 and OBC6, the resistance at 0 hours was high, moreover it largely increased after 300 hours heating as shown in Table 3.

TABLE 2

| Organic Boron Compound (OBC) | Chemical name (CAS #) | Melting point (° C.) | Structure | Product |
|---|---|---|---|---|
| OBC1 | Dimesitylborinic acid (20631-84-9) | 144 | | 473782-5G, Sigma-Aldrich Co. LLC. |
| OBC2 | 2,4,6-trimethyl phenylboronic acid (5980-97-2) | 115 | | 542318-5G, Sigma-Aldrich Co. LLC. |
| OBC3 | 3-aminophenyl-boronic acid monohydrate (206658-89-1) | 93 | | A1281, Tokyo Chemical Industry Co., Ltd. |

TABLE 2-continued

| Organic Boron Compound (OBC) | Chemical name (CAS #) | Melting point (° C.) | Structure | Product |
|---|---|---|---|---|
| OBC4 | Diethyl(3-pyridyl)borane (89878-14-8) | 172 | | 316369-10G, Sigma-Aldrich Co. LLC. |
| OBC5 | Tetrabutyl-anmonium butyltrinaphtylborate (219125-19-6) | 140 | | N3B, Showa Denko K.K. |
| OBC6 | Tetrabutyl-anmonium = butyltris-4-tertbutylphenyl borate (189947-86-2) | 187 | | BP3B, Showa Denko K.K. |

TABLE 3

(parts by weight)

| | Ex. 4 | Ex. 5 | Ex. 6 | Com. Ex. 2 | Com. Ex. 3 | Com. Ex. 4 |
|---|---|---|---|---|---|---|
| Cu powder | 100 | 100 | 100 | 100 | 100 | 100 |
| Organic boron compound | OBC1 | OBC2 | OBC3 | OBC4 | OBC5 | OBC6 |
|  | 5.1 | 3.1 | 3.0 | 2.8 | 10.4 | 13.57 |
| (Boron amount) | (0.21) | (0.21) | (0.21) | (0.21) | (0.21) | (0.21) |
| Organic vehicle | 32.3 | 32.3 | 32.3 | 32.3 | 32.3 | 32.3 |
| Specific electrical resistance at 0 h (mΩ · cm) | 0.108 | 0.107 | 0.074 | 0.23 | 0.78 | 1.92 |
| Specific electrical resistance at 300 h (mΩ · cm) | 0.145 | 0.117 | 0.08 | 0.341 | 1.08 | 3.34 |

The boron amount was examined by using a trimer of the boronic acid. An electrode was formed in the same manner as in Example 1 above except for using the conductive paste contained 2,4,6-triphenyl boroxin as a organic boron compound with different amounts as shown in Table 4 below and using a Cu powder coated with Ag of 12 wt % based on the weight of the conducive powder. The particle diameter (D50) of the conductive powder was same at 2.0 μm.

The specific electrical resistance at 0 hour was lower than 0.1 mΩ·cm and it was kept low even after 300 hours heating at 150° C. in Example 7 to 10.

TABLE 4

(parts by weight)

| | Example. 7 | Example. 8 | Example. 9 | Example. 10 |
|---|---|---|---|---|
| Cu powder | 100 | 100 | 100 | 100 |
| Organic boron compound: 2,4,6-triphenyl boroxin | 0.5 | 1.0 | 1.5 | 2.0 |
| (Boron amount) | (0.05) | (0.10) | (0.15) | (0.20) |
| Organic Vehicle | 32.1 | 32.1 | 32.1 | 32.1 |
| Specific electrical resistance at 0 h (mΩ · cm) | 0.045 | 0.039 | 0.049 | 0.055 |
| Specific electrical resistance at 300 h (mΩ · cm) | 0.065 | 0.050 | 0.052 | 0.062 |

What is claimed is:

1. A method of manufacturing a non-fired type electrode comprising the steps of:
   (a) applying a conductive paste on a substrate, wherein the substrate is selected from the group consisting of a polymer film, a glass substrate and a ceramic substrate, the conductive paste comprising;
      (i) 100 parts by weight of a conductive powder;
      (ii) an organic boron compound selected from the group consisting of an amine borate, a boronic acid, a boronic acid ester, a trimer of a boronic acid and a mixture thereof, wherein the boron (B) element of the organic boron compound is 0.03 to 1.4 parts by weight; and
      (iii) 20 to 150 parts by weight of an organic vehicle, wherein viscosity of the conductive paste is between 30 to 500 Pa·s at 10 rpm;
   (b) heating the applied conductive paste at 100 to 300° C.

2. The method of claim 1, wherein the organic boron compound is 0.5 to 20 parts by weight.

3. The method of claim 1, wherein the organic boron compound comprises a trimer of the boronic acid.

4. The method of claim 1, wherein the melting point of the organic boron compound is 50° C. or higher.

5. The method of claim 1, wherein the average particle size of the conductive powder is 0.5 to 10 μm.

6. The method of claim 1, wherein the conductive powder comprises a metal selected from the group consisting of aluminum (Al), nickel (Ni), copper (Cu), silver (Ag), gold (Au), platinum (Pt), palladium (Pd), molybdenum (Mo), tungsten (W), zinc (Zn), alloy thereof and a mixture thereof.

7. A device having the non-fired type electrode manufactured by the method of claim 1.

8. The method of claim 1, wherein the organic boron compound comprises a boronic acid expressed with formula (I) or (II):

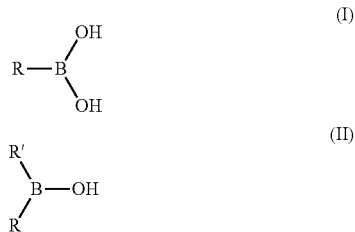

where R and R' is independently alkyl group, substituted alkyl group, alkenyl group, substituted alkenyl group, aryl group or substituted aryl group.

9. The method of claim 1, wherein the organic boron compound comprises a boronic acid ester expressed with formula (III) or (IV):

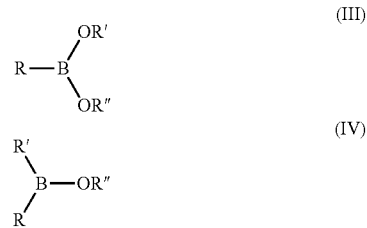

where R, R' and R" is independently alkyl group, substituted alkyl group, alkenyl group, substituted alkenyl group, aryl group or substituted aryl group.

* * * * *